(12) United States Patent
Okamoto et al.

(10) Patent No.: US 8,053,521 B2
(45) Date of Patent: Nov. 8, 2011

(54) CHEMICAL MECHANICAL POLISHING PAD

(75) Inventors: Takahiro Okamoto, Chuo-ku (JP);
Rikimaru Kuwabara, Chuo-ku (JP);
Keisuke Kuriyama, Chuo-ku (JP);
Shoei Tsuji, Chuo-ku (JP)

(73) Assignee: JSR Corporation, Tokyo (JP)

( * ) Notice: Subject to any disclaimer, the term of this patent is extended or adjusted under 35 U.S.C. 154(b) by 482 days.

(21) Appl. No.: 12/278,103

(22) PCT Filed: Jan. 30, 2007

(86) PCT No.: PCT/JP2007/051873
§ 371 (c)(1),
(2), (4) Date: Aug. 1, 2008

(87) PCT Pub. No.: WO2007/089004
PCT Pub. Date: Aug. 9, 2007

(65) Prior Publication Data
US 2009/0036045 A1 Feb. 5, 2009

(30) Foreign Application Priority Data

Feb. 3, 2006 (JP) ................................. 2006-027080

(51) Int. Cl.
*B24B 37/00* (2006.01)
*B24B 9/00* (2006.01)
*C08L 71/00* (2006.01)
*C08L 9/00* (2006.01)
*H01L 21/304* (2006.01)

(52) U.S. Cl. ........... 525/54.3; 525/88; 525/91; 525/187; 51/298; 451/526

(58) Field of Classification Search ................. 525/54.3, 525/187, 88, 91; 51/298; 451/526
See application file for complete search history.

(56) References Cited

U.S. PATENT DOCUMENTS

| 5,965,206 A | * | 10/1999 | Hilti et al. .................. 427/393.1 |
| 6,552,131 B1 | | 4/2003 | Higuchi et al. |
| 6,585,574 B1 | * | 7/2003 | Lombardo et al. ............ 451/285 |
| 6,645,264 B2 | * | 11/2003 | Hasegawa et al. .............. 51/299 |
| 2002/0173231 A1 | * | 11/2002 | Hasegawa .......................... 451/6 |
| 2006/0029428 A1 | * | 2/2006 | Taniguchi et al. ............. 399/176 |
| 2010/0067172 A1 | * | 3/2010 | Zhang et al. ................... 361/323 |
| 2010/0252047 A1 | * | 10/2010 | Kirk et al. ................ 128/206.19 |

FOREIGN PATENT DOCUMENTS

| CN | 1535824 A | 1/2005 |
| JP | 8-500622 | 1/1996 |
| JP | 8-216029 | 8/1996 |
| JP | 11-70463 | 3/1999 |
| JP | 2000-34416 | 2/2000 |
| JP | 2001 105305 | 4/2001 |
| JP | 2001-278985 | 10/2001 |
| JP | 2004 111940 | 4/2004 |
| JP | 2004 343016 | 12/2004 |
| JP | 2005 303121 | 10/2005 |
| WO | WO 94/04599 | 3/1994 |

OTHER PUBLICATIONS

Hasegawa et al., electronic translation of the specification of JP 2000-0344416 (Feb. 2000).*
European Search Report in PCT/JP07051873 dated Jul. 15, 2011.

* cited by examiner

*Primary Examiner* — Jeffrey Mullis
(74) *Attorney, Agent, or Firm* — Oblon, Spivak, McClelland, Maier & Neustadt, L.L.P.

(57) ABSTRACT

The present invention relates to polishing pads, including at least 60 to 99 parts by weight of a polymer matrix (A) having 1,2-polybutadiene; and 1 to 40 parts by weight of component (B) having a copolymer having a polyether block, where the total amount of the polishing pad is 100 parts by mass, polymer matrix (A) includes 1,2-polybutadiene in an amount of at least 60 parts by weight, relative to 100 parts by mass of the polishing pad, component (B) includes the copolymer having a polyether block in an amount of at most 40 parts by weight relative to 100 parts by mass of the polishing pad, and the polishing pads have a surface resistivity of $2.6 \times 10^7$ to $9.9 \times 10^{13} \Omega$.

16 Claims, No Drawings

CHEMICAL MECHANICAL POLISHING PAD

CROSS REFERENCE TO RELATED APPLICATION

This application is a 371 of PCT/JP07/051,873, filed on Jan. 30, 2007, and claims priority to Japanese Patent Application No. 2006-027080, filed on Feb. 3, 2006.

The present invention relates to a chemical mechanical polishing pad.

BACKGROUND ART

In the manufacture of a semiconductor device, chemical mechanical polishing (generally abbreviated as CMP) is now often used as a polishing technique capable of forming an extremely flat surface. Chemical mechanical polishing is a technique for polishing chemomechanically by letting an aqueous dispersion for chemical mechanical polishing flow down over the surface of a chemical mechanical polishing pad while the chemical mechanical polishing pad and the surface to be polished are brought into slide contact with each other. It is known that the polishing result is greatly affected by the properties and characteristics of the chemical mechanical polishing pad in this chemical mechanical polishing. A wide variety of chemical mechanical polishing pads have been proposed up till now.

For example, JP-A 11-70463 and JP-A 8-216029 propose a chemical mechanical polishing method for carrying out polishing by using polyurethane foam containing fine pores as a chemical mechanical polishing pad and holding an aqueous dispersion for chemical mechanical polishing in pores open to the surface of the pad.

JP-A 8-500622 and JP-A 2000-34416 propose a polishing pad containing a water-soluble polymer dispersed in a water-insoluble matrix resin. This pad is capable of polishing by holding an aqueous dispersion for chemical mechanical polishing in pores formed by the dissolution or elimination of only water-soluble particles which came into contact with the aqueous dispersion for chemical mechanical polishing during chemical mechanical polishing out of water-soluble particles.

Since it is difficult to control the foaming of polyurethane in a desired state in the former pad out of these chemical mechanical polishing pads, the quality of the pad varies and the removal rate and the processing state vary as well. Particularly, a surface defect called "scratch" may be produced on the polished surface and the improvement of the polished surface is desired. Meanwhile, although it is easy to control the size and distribution of pores formed during polishing in the latter pad, in-plane uniformity in the amount of polishing of the polished surface (variations in the amount of polishing at specific points of the polished surface) may become unsatisfactory. Therefore, the improvement of the in-plane uniformity in the amount of polishing is also desired.

Due to growing demand for semiconductor devices having higher integration and a finer design rule, specifications required for the surface state of the polished surface are becoming stricter. Further, a higher removal rate is desired to shorten the process time.

In the above situation, a chemical mechanical polishing pad which gives satisfactory polishing results in terms of the suppression of the production of scratches on the polished surface and in-plane uniformity in the amount of polishing while a high removal rate is maintained is not known yet.

DISCLOSURE OF THE INVENTION

It is an object of the present invention which has been made in view of the above situation to provide a chemical mechanical polishing pad which provides a high removal rate, can suppress the production of scratches on the polished surface satisfactorily and can achieve high in-plane uniformity in the amount of polishing.

According to the present invention, the above object can be attained by a chemical mechanical polishing pad having a surface resistivity of its polishing layer of $1.0 \times 10^7$ to $9.9 \times 10^{13} \Omega$.

BEST MODE FOR CARRYING OUT THE INVENTION

The chemical mechanical polishing pad of the present invention has a surface resistivity of its polishing layer of $1.0 \times 10^7$ to $9.9 \times 10^{13} \Omega$. As long as this requirement is satisfied, the polishing layer may be made of any material. For example, it may be made of a composition comprising (A) a polymer matrix component having a volume resistivity of $1.0 \times 10^{13}$ to $9.9 \times 10^{17}$ $\Omega \cdot cm$ and (B) a component having a volume resistivity of $1.0 \times 10^6$ to $9.9 \times 10^{12}$ $\Omega \cdot cm$. A description is given of each component contained in a preferred composition for forming the polishing layer of the chemical mechanical polishing pad of the present invention.

Component (A)

The component (A) which is preferably used in the composition for manufacturing the polishing layer of the chemical mechanical polishing pad of the present invention is a polymer matrix component having a volume resistivity of $1.0 \times 10^{13}$ to $9.9 \times 10^{17}$ $\Omega \cdot cm$. This value is preferably $5.0 \times 10^{13}$ to $9.9 \times 10^{17}$ $\Omega \cdot cm$, more preferably $1.0 \times 10^{14}$ to $5.0 \times 10^{17}$ $\Omega \cdot cm$.

The component (A) is, for example, a homopolymer of a conjugated diene, a copolymer of two or more conjugated dienes or a copolymer of a conjugated diene and another monomer.

Examples of the conjugated diene include 1,3-butadiene, isoprene, 2,3-dimethyl-1,3-butadiene, 1,3-pentadiene, 2-methyl-1,3-pentadiene, 1,3-hexadiene and 4,5-diethyl-1,3-octadiene.

The another monomer is, for example, an unsaturated carboxylate or a vinyl cyanide compound. Examples of the unsaturated carboxylate include (meth)acrylate, ethyl (meth) acrylate, n-propyl(meth)acrylate, i-propyl (meth)acrylate, cyclohexyl(meth)acrylate, phenyl (meth)acrylate, 2-methoxyethyl(meth)acrylate and methoxydiethylene glycol (meth)acrylate, and examples of the vinyl cyanide compound include (meth)acrylonitrile, α-chloroacrylonitrile and vinylidene cyanide.

When the component (A) is a copolymer of a conjugated diene and another monomer, the copolymerization ratio of the another monomer is preferably 50% or less by weight, more preferably 30% or less by weight based on the total of the conjugated diene and the another monomer.

The component (A) is preferably a homopolymer of 1,3-butadiene or a copolymer of 1,3-butadiene and another monomer. Examples of the homopolymer of 1,3-butadiene include butadiene rubber and 1,2-polybutadiene, and examples of the copolymer of 1,3-butadiene and another monomer include butadiene.acrylonitrile rubber and butadiene.methyl methacrylate rubber.

Out of these, the component (A) is more preferably a homopolymer of 1,3-butadiene, much more preferably 1,2-polybutadiene.

The weight average molecular weight in terms of polystyrene measured by gel permeation chromatography of the component (A) is preferably 5,000 to 1,000,000, more preferably 10,000 to 500,000.

Component (B)

The component (B) which is preferably used in the composition for manufacturing the polishing layer of the chemical mechanical polishing pad of the present invention is an additive having a volume resistivity of $1.0\times10^6$ to $9.9\times10^{12}$ $\Omega\cdot cm$. This value is preferably $1.0\times10^6$ to $5.0\times10^{12}$ $\Omega\cdot cm$, more preferably $5.0\times10^6$ to $9.9\times10^{11}$ $\Omega\cdot cm$.

The component (B) is, for example, a polymer containing an ether bond in the main chain, a compound containing an ester bond and having the above volume resistivity (excluding a polymer containing an ether bond in the main chain) or another polymer having the above volume resistivity.

Examples of the polymer containing an ether bond in the main chain include polyoxyethylene, polyoxyethylene alkyl ether, polyoxyethylene alkylphenol ether, polyether ester amide, polyether amide imide, polypropylene glycol, polyoxypropylene butyl ether, polyoxypropylene glyceryl ether, polyoxypropylene sorbitol, oxyethylene-epichlorohydrin copolymer, methoxypolyethylene glycol (meth)acrylate copolymer, polyoxyethylene lauryl ether, polyoxyethylene cetyl ether, polyoxyethylene oleyl ether, polyoxyethylene oleyl cetyl ether, polyoxyethylene polyoxypropylene glycol, polyoxyethylene polyoxypropylene butyl ether, polyoxyethylene polyoxypropylene hexylene glycol ether, polyoxyethylene polyoxypropylene trimethylolpropane, polyoxyethylene polyoxypropylene glyceryl ether, a copolymer having a polyether block and a polyolefin block, chlorine-containing polyether, polyacetal resin, alkyl glycoside, polyoxyethylene fatty acid amine, polyoxyethylene fatty acid esters, polyoxyethylene sorbitan fatty acid ester, and polymers disclosed by JP-A 2001-278985. The polyoxyethylene fatty acid esters include polyethylene glycol monostearate, polyethylene glycol laurate, polyethylene glycol monooleate and polyethylene glycol distearate.

Examples of the compound containing an ester bond and having the above volume resistivity (excluding a polymer containing an ether bond in the main chain) include saccharose fatty acid esters, sorbitan fatty acid esters, fatty acid glycerin esters and (meth)acrylate (co)polymers. Acrylate copolymers (acrylic rubber) are preferred as the (meth)acrylate copolymers.

Examples of the another polymer having the above volume resistivity include polyvinyl alcohol, polyvinyl pyrrolidone, poly(meth)acrylic acid, sulfonated polyisoprene, sulfonated isoprene copolymer and modified polyamide resin. The term "modified polyamide resin" used herein means a polymer having a block having a tertiary amine and a block having a polyalkylene glycol chain. The tertiary amine may be existent in the main chain or side chain of the block having a tertiary amine. The block having the tertiary amine in the main chain may be derived from a monomer such as aminoethyl piperazine or bisaminopropyl piperazine. The block having the tertiary amine in the side chain may be derived from a monomer such as α-dimethylamino-∈-caprolactam. The block having a polyalkylene glycol chain may be derived from a polyalkylene glycol such as polyethylene glycol or polypropylene glycol.

Out of these, a polymer containing an ether bond in the main chain, acrylic rubber or modified polyamide resin is more preferred, and a copolymer having a polyether block and a polyolefin block, chlorine-containing polyether, acrylic rubber or modified polyamide resin is particularly preferred as the component (B) because they have suitable compatibility with the component (A).

The weight average molecular weight in terms of polystyrene measured by gel permeation chromatography of the component (B) is preferably 5,000 to 5,000,000, more preferably 30,000 to 5,000,000.

The amount of the component (B) used in the chemical mechanical polishing pad of the present invention is preferably 0.5 to 40% by mass, more preferably 1 to 35% by mass, much more preferably 3 to 30% by mass based on the total of the components (A) and (B).

Other Components

The preferred composition for forming the polishing layer of the chemical mechanical polishing pad of the present invention comprises the above components (A) and (B) and optionally other components. The other components include (C) water-soluble particles, (D) a crosslinking agent, (E) a filler, (F) a softening agent, (G) an antioxidant, (H) an ultraviolet light absorber, (I) a lubricant and (J) a plasticizer.

(C) Water-Soluble Particles

The water-soluble particles (C) are particles which are dispersed in the chemical mechanical polishing pad as particles, are eliminated from the chemical mechanical polishing pad upon their contact with an aqueous dispersion for chemical mechanical polishing during chemical mechanical polishing and have the function of forming pores near the surface of the pad. This elimination may occur when they dissolve upon their contact with water contained in the aqueous dispersion or when they swell and become colloidal by absorbing water.

The water-soluble particles (C) have the effect of increasing the indentation hardness of the chemical mechanical polishing pad in addition to the effect of forming pores. This makes it possible to increase pressure to be applied to the object to be polished, thereby improve the removal rate and obtain higher planality. Therefore, the water-soluble particles (C) are preferably solid which can assure sufficiently high indentation hardness for the chemical mechanical polishing pad.

Although the material constituting the water-soluble particles (C) is not particularly limited, they are, for example, organic water-soluble particles or inorganic water-soluble particles. The organic water-soluble particles are made of dextrin, cyclodextrin, mannitol, sugar (such as lactose), cellulose (such as hydroxypropyl cellulose or methyl cellulose), starch or protein. The inorganic water-soluble particles are made of potassium acetate, potassium nitrate, potassium carbonate, potassium bicarbonate, potassium chloride, potassium bromide, potassium phosphate or magnesium nitrate.

Out of these, organic water-soluble particles are preferred, and water-soluble particles made of cyclodextrin are particularly preferred.

These water-soluble particles (C) may be used alone or in combination of two or more. One type of water-soluble particles made of a predetermined material, or two or more different types of water-soluble particles made of different materials may be used.

The average particle diameter of the water-soluble particles (C) is preferably 0.1 to 500 µm, more preferably 0.5 to 100 µm. When water-soluble particles having an average particle diameter within the above range are used, a chemical mechanical polishing pad which is excellent in the retention capavility of the aqueous dispersion for chemical mechanical polishing in the pores formed on the surface and vicinity of the pad and the balance of the mechanical strength of the pad can be obtained.

The amount of the water-soluble particles (C) is preferably 300 parts or less by weight, more preferably 1 to 300 parts by weight, much more preferably 1 to 150 parts by weight, particularly preferably 5 to 100 parts by weight based on 100 parts by weight of the total of the components (A) and (B).

The volume ratio of the water-soluble particles (C) to the polishing layer of the chemical mechanical polishing pad is preferably 90% or less by volume, more preferably 0.1 to 90% by volume, much more preferably 0.1 to 60% by volume, particularly preferably 0.5 to 40% by volume of the total.

When the amount and volume of the water-soluble particles (C) are set to the above ranges, a chemical mechanical polishing pad having excellent polishing properties can be obtained.

It is preferred that the water-soluble particles (C) should dissolve in water or swell only when they are exposed to the surface layer of the polishing pad and should not absorb moisture or swell when they are existent in the inside of the polishing pad. Therefore, the water-soluble particles may have an outer shell for suppressing moisture absorption on at least part of their outermost portion. This outer shell may be physically adsorbed to the water-soluble particle, chemically bonded to the water-soluble particle, or in contact with the water-soluble particle by physical adsorption and chemical bonding. Examples of the material forming the outer shell include epoxy resin, polyimide, polyamide, polysilicate and silane coupling agent. The water-soluble particles (C) may consist of water-soluble particles having an outer shell and water-soluble particles having an outer shell. Even when the water-soluble particles having an outer shell are not entirely covered with the outer shell, the above effect can be fully obtained.

(D) Crosslinking Agent

The crosslinking agent (D) which can be used in the composition for manufacturing the polishing layer of the chemical mechanical polishing pad of the present invention is, for example, a hydrogen peroxide, organic crosslinking agent or inorganic crosslinking agent. The organic crosslinking agent is an organic peroxide such as dicumyl peroxide, diethyl peroxide, di-t-butyl peroxide, diacetyl peroxide or diacyl peroxide, and the inorganic crosslinking agent is sulfur or the like.

An organic peroxide is preferably used as the crosslinking agent (D) from the viewpoints of handling ease and no contamination in the chemical mechanical polishing step.

The amount of the crosslinking agent is preferably 3.0 parts or less by weight, more preferably 0.01 to 3.0 parts by weight, much more preferably 0.2 to 3.0 parts by weight, particularly preferably 0.3 to 2.0 parts by weight based on 100 parts by weight of the component (A).

Composition for Chemical Mechanical Polishing Pad

The preferred composition for the manufacture of the polishing layer of the chemical mechanical polishing pad of the present invention preferably comprises the above components (A) and (B) and optionally one or more of the components (C) to (J). It is preferred that the composition should contain the water-soluble particles (C) or the crosslinking agent (D) in addition to the components (A) and (B), and it is more preferred that the composition should contain the components (A) to (D).

To prepare the above composition, the components which should be contained in the composition are compounded together by means of a suitable mixing machine. A known mixing machine such as a roll, kneader, Banbury mixer or extruder (single-screw or multi-screw extruder) may be used.

When the composition contains the water-soluble particles (C), the water-soluble particles (C) are preferably solid at the compounding temperature. When water-soluble particles which are classified as particles having the above preferred average particle diameter are used and compounded under the condition that they are solid, they can be dispersed with the above preferred average particle diameter regardless of the degree of compatibility between the water-soluble particles and a water-insoluble portion.

Therefore, the type of the water-soluble particles (C) is preferably selected according to the processing temperature of a polymer matrix material in use.

When the composition contains the crosslinking agent (D), the crosslinking agent (D) is added to a mixture obtained by compounding the components which should be contained in the composition excluding the crosslinking agent (D) and further compounded to obtain a composition for a chemical mechanical polishing pad. A molded product formed from the composition obtained by the above two-stage compounding has high uniformity in the degree of crosslinking as a whole, and a chemical mechanical polishing pad which provides a polished surface having extremely high surface uniformity can be obtained.

Chemical Mechanical Polishing Pad and its Manufacturing Process

Preferably, the chemical mechanical polishing pad of the present invention has a polishing layer formed from the above composition for a chemical mechanical polishing pad. The polishing layer can be obtained by molding the above composition into a desired pad rough form. To mold the rough form, a molding method using a metal mold corresponding to a desired rough form and a method in which the composition is molded into a sheet and the sheet is then cut into a desired form may be employed.

When the composition contains the crosslinking agent (D), the crosslinking reaction of the component (A) is carried out at the same time by heating the composition to make the above rough form. The heating temperature is preferably 80 to 200° C., more preferably 100 to 180° C., and the heating time is preferably 3 to 60 minutes, more preferably 5 to 30 minutes.

The chemical mechanical polishing pad of the present invention may have a groove(s) or a recessed portion(s) having a desired shape on the polishing surface and/or the non-polishing surface. The groove(s) or recessed portion(s) may be formed by cutting after the composition is molded into a pad rough form or by using a metal mold having a projection(s) corresponding to the desired groove(s) or recessed portion(s) when the rough form is made by using the mold.

The shape of the polishing layer of the chemical mechanical polishing pad of the present invention is not particularly limited and may be disk-like or polygonal. It may be suitably selected according to a polishing machine in which the chemical mechanical polishing pad of the present invention is to be set.

The size of the polishing layer is not particularly limited. In the case of a disk-like pad, the polishing layer has a diameter of 150 to 1,200 mm, specifically 500 to 800 mm and a thickness of 1.0 to 5.0 mm, specifically 1.5 to 3.0 mm.

The shore D hardness of the polishing layer is preferably 35 to 100, more preferably 40 to 90. When the polishing layer has such hardness, a chemical mechanical polishing pad which has a sufficiently high removal rate and provides a polished surface having a good surface state can be obtained.

The chemical mechanical polishing pad of the present invention may be composed of only the polishing layer manufactured as described above or may be a multi-layer pad comprising a support layer on the non-polishing side (rear side) of the polishing layer.

The above support layer is a layer formed on the rear surface to support the chemical mechanical polishing pad.

Although the characteristic properties of this support layer are not particularly limited, the support layer is preferably softer than the polishing layer. When the pad has a soft support layer, if the polishing layer is thin (for example, 1.0 mm or less), it is possible to prevent the pad from rising during polishing or the surface of the polishing layer from curving, whereby polishing can be carried out stably. The hardness of this support layer is preferably 90% or less, more preferably 50 to 90%, much more preferably 50 to 80%, particularly preferably 50 to 70% of the hardness of the polishing layer.

The chemical mechanical polishing pad of the present invention is set in a commercially available polishing machine to be used for chemical mechanical polishing in accordance with a known method.

Examples of the material which can be subjected to chemical mechanical polishing with the chemical mechanical polishing pad of the present invention include substrate materials, wiring materials, via plug materials, electrode materials, insulating materials and barrier metal materials. The substrate materials include single crystal silicon, the wiring materials include tungsten, aluminum, copper and alloys of at least one of them and another metal, the via plug materials include the same materials as the above wiring materials, the electrode materials include polycrystal silicon and amorphous silicon, the insulating materials include $SiO_2$-based insulating materials, low-dielectric organic insulating materials and hydrogen-containing porous insulating materials (HSQ-SOG), and the barrier metal materials include nitride materials such as silicon nitride, tantalum nitride and titanium nitride and metal materials such as tantalum, titanium and tungsten.

Out of these, the $SiO_2$-based insulating materials include a thermally oxidized film, P-TEOS, $O_3$-TEOS, HDP-$SiO_2$, BPSG (material containing one or both of boron and phosphorus in $SiO_2$) and FSG (fluorinated $SiO_2$-based insulating film).

The above thermally oxidized film is formed by exposing high-temperature silicon to oxidizing atmosphere to chemically react silicon with oxygen or silicon with water.

The above P-TEOS is formed from tetraethyl orthosilicate (TEOS) by chemical vapor deposition using plasma as a promoter.

The above $O_3$-TEOS is formed from tetraethyl orthosilicate (TEOS) by chemical vapor deposition in the presence of ozone.

The above HDP-$SiO_2$ is formed from tetraethyl orthosilicate (TEOS) by chemical vapor deposition using high-density plasma as a promoter.

The above BPSG is formed by atmospheric pressure CVD (AP-CVD) or low-pressure CVD (LP-CVD).

The above FSG is formed by chemical vapor deposition using high-density plasma as a promoter.

The object to be polished is preferably made of one or more of the above materials.

Planarization for shallow trench isolation (STI), the formation of damascene wiring, the formation of a via plug and the formation of an interlayer insulating film can be performed by chemical mechanical polishing with the chemical mechanical polishing pad of the present invention.

For the above shallow trench isolation, an $SiO_2$-based insulating material can be polished. For the formation of damascene wiring, a wiring material can be polished in the initial stage, and a wiring material and an insulating material and optionally a barrier metal can be polished in the latter stage of polishing. Further, a via plug material can be polished for the formation of a via plug, and an $SiO_2$-based insulating material, an organic insulating material having a low dielectric constant and a hydrogen-containing porous insulating material can be polished for the formation of an interlayer insulating film.

The chemical mechanical polishing pad of the present invention shows a high removal rate, can provide a very flat polished surface and suppresses the production of scratches as obvious from Examples which will be given hereinafter. The reason why the chemical mechanical polishing pad of the present invention has such excellent effects is not made clear yet. However, it is assumed that, when the surface resistivity of the polishing layer of the pad is set to a predetermined range, a suitable amount of adsorption water is existent on the surface of the polishing layer, prevents the adhesion of foreign matter to the polishing layer, suppresses the production of scratches, and optimizes affinity for the aqueous dispersion for chemical mechanical polishing, whereby the aqueous dispersion is supplied uniformly into the gap between the polishing layer and the object to be polished, thereby improving the uniformity of the polished surface.

EXAMPLES

Example 1

[1] Manufacture of Chemical Mechanical Polishing Pad 60 parts by mass of 1,2-polybutadiene (manufactured by JSR Corporation, trade name of JSR RB830) as the component (A), 40 parts by mass of PELESTAT 300 (trade name, manufactured by Sanyo Chemical Industries, Ltd., a copolymer having a polyether block and a polyolefin block, weight average molecular weight Mw=$5.0 \times 10^4$) as the component (B) and 16.8 parts by mass of β-cyclodextrin (manufactured by Bio Research Corporation of Yokohama, trade name of Dexy Pearl β-100) as the component (C) were compounded together at 150° C. by means of an extruder heated at 120° C. at 120 rpm. Thereafter, 0.3 part by mass of dicumyl peroxide (manufactured by NOF Corporation, trade name of Percumyl D) was added to the above compounded product and further compounded at 120° C. at 60 rpm to prepare a composition for a chemical mechanical polishing pad. This composition for a chemical mechanical polishing pad was molded in a metal mold by heating at 170° C. for 18 minutes to obtain a disk-like molded product having a diameter of 60 cm and a thickness of 2.8 mm. Concentric grooves having a width of 0.5 mm, a pitch of 2 mm and a depth of 1.4 mm with the center of the polishing surface as the center thereof were formed on one side of this molded product by a cutting machine (manufactured by Kato Machine Corporate) to manufacture a chemical mechanical polishing pad. The average particle diameter of β-cyclodextrin (C) contained in the chemical mechanical polishing pad manufactured herein was 15 μm and the volume ratio of β-cyclodextrin was 10% by volume of the total.

The weight average molecular weight of the component (B) was measured by gel permeation chromatography under the following conditions.
Measuring instrument: GPC HLC-8120 of Tosoh Corporation
Column: TSK gel α-M of Tosoh Corporation
Developing solvent: mixed solvent of dimethyl formamide and methanol

[2] Measurement of Surface Resistivity and Volume Resistivity

A test specimen measuring 100 mm×100 mm×2 mm was molded from the composition for a chemical mechanical polishing pad prepared as described above by a compression molding machine having a mold temperature of 170° C. at a pressure of 150 kg/cm² for a molding time of 18 minutes. After the manufactured test specimen was cured at a fixed temperature of 23° C. and a fixed humidity of 50% RH for 16 hours or more, the surface resistivity (Rs) of the specimen was measured by a high-resistance meter (manufactured by Agilent Technologies Japan, Ltd., trade name of Agilent4339B) at a temperature of 23° C., a humidity of 50% RH and an application voltage of 750 V (in accordance with JIS-K6911).

Test specimens were formed by using 1,2-polybutadiene as the component (A) and PELESTAT 300 as the component (B) to measure their volume resistances (Rv) by the above method so as to obtain their volume resistivities from the following equation.

$$\rho v = (\pi d^2/4t) \times Rv$$

($\rho v$ is a volume resistivity ($\Omega \cdot cm$), $\pi$ is a circular constant, d is the inner diameter (cm) of the main electrode, t is the thickness (cm) of the test specimen, and Rv is a volume resistivity ($\Omega$)).

These results are shown in Table 1 and Table 2.

[3] Evaluation of Chemical Mechanical Polishing Properties

The chemical mechanical polishing pad manufactured in [1] above was set in a chemical mechanical polishing machine (model EPO112, manufactured by Ebara Corporation) to polish an 8-inch a wafer having a copper film as a film to be processed under the following conditions. The iCue5003 (manufactured by Cabot Microelectronics Corporation) was used as slurry.
Slurry flow rate: 200 ml/min
Head pressure: 250 hPa
Platen revolution rate: 70 rpm
Head revolution rate: 70 rpm
Polishing time: 60 seconds
(1) Evaluation of Removal Rate The removal rate was measured by an electroconductive film thickness meter (manufactured by KLA-TENCOR Corporation, Omnimap RS75) in accordance with the following procedure.

21 specific points were set equally in the diameter direction excluding a 5 mm peripheral portion of a wafer having an 8-inch copper film, the polishing rates at these points were calculated from the difference in the thickness of the copper film before and after polishing and the polishing time, and the average value of the removal rates was taken as the removal rate.

(2) Evaluation of In-Plane Uniformity in the Amount of Polishing

The in-plane uniformity in the amount of polishing was calculated from the difference in thickness (to be designated as "amount of polishing") before and after polishing at the above 21 specific points based on the following equation. In-plane uniformity in the amount of polishing (%)=(standard deviation of the amount of polishing÷average value of the amount of polishing)×100

The results are shown in Table 2. When this value is 5% or less, it can be said that the in-plane uniformity in the amount of polishing is satisfactory.

(3) Evaluation of the Number of Scratches

The inspection of defects on the copper film after chemical mechanical polishing was carried out by using a defect inspection machine (manufactured by KLA-TENCOR Corporation, KLA2351). The number of defects on the entire surface of the wafer was counted by the defect inspection machine at a pixel size of 0.62 µm and a threshold value of 30. 100 out of the defects were extracted at random and displayed on the screen of the machine to be observed so as to check whether these defects were scratches or adhered foreign matter (for example abrasive grains contained in the aqueous dispersion for chemical mechanical polishing). The ratio of scratches having a long diameter of 0.20 µm or more to the total number of defects was calculated to obtain the number of scratches over the entire surface of the wafer. The results are shown in Table 2.

Examples 2 to 9 and Comparative Examples 1 to 6

Chemical mechanical polishing pads were manufactured and evaluated in the same manner as in Example 1 except that the types and amounts of the components (A), (B) and (C) were changed as shown in Table 1. The results are shown in Table 1 and Table 2.

Comparative Example 7

A porous polyurethane polishing pad (manufactured by Nitta Haas Inc., trade name of IC1000) was used as a chemical mechanical polishing pad and evaluated in the same manner as in Example 1. The results are shown in Table 2.

For the evaluation of surface resistivity in Comparative Example 7, the IC1000 was cut into a piece measuring 100 mm×100 mm×2 mm to be used as a test specimen.

TABLE 1

| | polymer matrix (A) | | | component (B) | | | water-soluble particles (C) | |
|---|---|---|---|---|---|---|---|---|
| | type | volume resistivity ($\Omega \cdot cm$) | amount (parts by weight) | type | volume resistivity ($\Omega \cdot cm$) | amount (parts by weight) | type | amount (parts by weight) |
| Ex. 1 | A1 | $1.6 \times 10^{17}$ | 60 | B1 | $2.0 \times 10^6$ | 40 | C1 | 16.8 |
| Ex. 2 | A1 | $1.6 \times 10^{17}$ | 95 | B1 | $2.0 \times 10^6$ | 5 | — | 0 |
| Ex. 3 | A1 | $1.6 \times 10^{17}$ | 99 | B1 | $2.0 \times 10^6$ | 1 | C1 | 1.0 |
| Ex. 4 | A1 | $1.6 \times 10^{17}$ | 90 | B2 | $2.5 \times 10^{10}$ | 10 | C1 | 40.0 |
| Ex. 5 | A1 | $1.6 \times 10^{17}$ | 80 | B3 | $3.2 \times 10^9$ | 20 | C1 | 16.8 |
| Ex. 6 | A1 | $1.6 \times 10^{17}$ | 70 | B4 | $2.8 \times 10^6$ | 30 | C1 | 16.8 |
| Ex. 7 | A2 | $4.7 \times 10^{13}$ | 85 | B1 | $2.0 \times 10^6$ | 15 | — | 0 |
| Ex. 8 | A1 | $1.6 \times 10^{17}$ | 70 | B5 | $3.2 \times 10^{11}$ | 30 | C1 | 16.8 |
| Ex. 9 | A1 | $1.6 \times 10^{17}$ | 90 | B6 | $4.7 \times 10^{10}$ | 10 | C1 | 16.8 |
| C. Ex. 1 | A1 | $1.6 \times 10^{17}$ | 80 | b1 | $3.4 \times 10^2$ | 20 | C1 | 16.8 |

TABLE 1-continued

|  | polymer matrix (A) | | | component (B) | | | water-soluble particles (C) | |
| --- | --- | --- | --- | --- | --- | --- | --- | --- |
|  | type | volume resistivity ($\Omega \cdot cm$) | amount (parts by weight) | type | volume resistivity ($\Omega \cdot cm$) | amount (parts by weight) | type | amount (parts by weight) |
| C. Ex. 2 | A1 | $1.6 \times 10^{17}$ | 99.5 | B2 | $2.5 \times 10^{10}$ | 0.5 | — | 0 |
| C. Ex. 3 | A1 | $1.6 \times 10^{17}$ | 100 | — | — | 0 | C1 | 16.8 |
| C. Ex. 4 | A1 | $1.6 \times 10^{17}$ | 55 | B1 | $2.0 \times 10^{6}$ | 45 | C1 | 16.8 |
| C. Ex. 5 | A1 | $1.6 \times 10^{17}$ | 70 | b2 | $1.2 \times 10^{14}$ | 30 | — | 0 |
| C. Ex. 6 | A1 | $1.6 \times 10^{17}$ | 90 | B3 | — | 10 | C1 | 16.8 |

Symbols in the columns for the types of the components (A), (B) and (C) in Table 1 represent the following substances.
(A1): JSR RB830 of JSR Corporation (1,2-polybutadiene)
(A2): E1080A of Toyobo Co., Ltd. (polyurethane elastomer)
(B1): PELESTAT 300 of Sanyo Chemical Industries, Ltd. (copolymer having a polyether block and a polyolefin block, Mw=$5.0 \times 10^{4}$)
(B2): DM-E70 of Daiso Chemical Co., Ltd. (chlorine-containing polyether)
(B3): JSR AR of JSR Corporation (acrylic rubber)
(B4): A-70 of Toray Fine Chemicals Co., Ltd. (modified polyamide resin, Mw=$3.3 \times 10^{4}$)
(B5): Elestomaster SB-10 of Kao Corporation (Mw=$2.0 \times 10^{5}$)
(B6): ALKOX E-240 of Meisei Kasei Kogyo Co., Ltd. (polyethylene oxide, Mw=$4.5 \times 10^{6}$)
(b1): Denka Emicon P-510-1-1 of Denki Kagaku Kogyo Kabushiki Kaisha
(b2): Amilus S731 of Toray Industries, Inc. (polyacetal resin)
(b3): PEG-200 of Sanyo Chemical Industries, Ltd. (polyethylene glycol, Mw=$2.0 \times 10^{2}$, since the component (b3) is liquid, its surface resistivity cannot be defined.)
(C1): Dexy Pearl β-100 of Bio Research Corporation of Yokohama (β-cyclodextrin)
"-" in the table means that the component corresponding to that of the column was not used.

The weight average molecular weights Mw of the components (B1), (B4), (B5) and (b3) were measured in the same manner as in Example 1.

TABLE 2

|  | | chemical mechanical polishing properties | | |
| --- | --- | --- | --- | --- |
|  | Surface resistivity of polishing layer ($\Omega$) | Removal rate (nm/minute) | in-plane uniformity in amount of polishing (%) | number of scratches per wafer |
| Ex.1 | $2.6 \times 10^{7}$ | 3,600 | 3.8 | 51 |
| Ex.2 | $3.3 \times 10^{11}$ | 3,900 | 3.3 | 85 |
| Ex.3 | $9.2 \times 10^{12}$ | 4,200 | 4.1 | 102 |
| Ex.4 | $5.5 \times 10^{13}$ | 4,500 | 4.5 | 153 |
| Ex.5 | $6.2 \times 10^{11}$ | 4,000 | 3.2 | 64 |
| Ex.6 | $1.3 \times 10^{8}$ | 3,800 | 3.5 | 72 |
| Ex.7 | $7.5 \times 10^{12}$ | 3,900 | 3.9 | 125 |
| Ex.8 | $1.5 \times 10^{12}$ | 4,300 | 2.9 | 134 |
| Ex.9 | $7.3 \times 10^{13}$ | 3,500 | 2.4 | 45 |
| C.Ex.1 | $8.2 \times 10^{4}$ | 2,700 | 6.2 | 65 |
| C.Ex.2 | $4.6 \times 10^{14}$ | 3,400 | 5.2 | 225 |
| C.Ex.3 | $1.5 \times 10^{16}$ | 2,800 | 8.5 | 512 |
| C.Ex.4 | $9.8 \times 10^{6}$ | 3,200 | 5.4 | 163 |
| C.Ex.5 | $7.8 \times 10^{15}$ | 2,900 | 7.3 | 316 |
| C.Ex.6 | $6.5 \times 10^{14}$ | 3,600 | 5.1 | 198 |
| C.Ex.7 | $2.8 \times 10^{14}$ | 3,900 | 4.8 | 1,852 |

As obvious from the evaluation results of the above Examples and Comparative Examples, when the chemical mechanical polishing pad of the present invention having a surface resistivity of its polishing layer of $1.0 \times 10^{7}$ to $9.9 \times 10^{13} \Omega$ is used, a flat polished surface is obtained at a high removal rate and the production of scratches can be suppressed.

Meanwhile, it is understood that, when the above requirements are not satisfied (Comparative Examples 1 to 7), either one or both of in-plane uniformity in the amount of polishing and the suppression of scratches become unsatisfactory.

The invention claimed is:

1. A polishing pad, comprising
   60 to 99 parts by weight of a polymer matrix (A) comprising 1,2-polybutadiene; and
   1 to 40 parts by weight of component (B) comprising a copolymer having a polyether block,
   wherein
   the total amount of the polishing pad is 100 parts by weight,
   polymer matrix (A) comprises 1,2-polybutadiene in an amount of at least 60 parts by weight, relative to 100 parts by weight of the polishing pad,
   component (B) comprises the copolymer having a polyether block in an amount of at most 40 parts by weight relative to 100 parts by weight of the polishing pad, and
   the polishing pad has a surface resistivity of from $2.6 \times 10^{7}$ to $9.9 \times 10^{13} \Omega$.

2. The polishing pad according to claim 1, wherein components (A) and (B) comprise a first polishing layer of said pad having the surface resistivity of from $2.6 \times 10^{7}$ to $9.9 \times 10^{13} \Omega$.

3. The polishing pad according to claim 1, wherein the polymer matrix component (A) further comprises a copolymer of two or more conjugated dienes or a copolymer of a conjugated diene and an unsaturated carboxylate or a vinyl cyanide compound, and
   the component (B) further comprises an acrylic rubber or modified polyamide resin.

4. The polishing pad according to claim 1, further comprising at least one of (C) water-soluble particles and (D) a crosslinking agent.

5. The polishing pad according to claim 1, further comprising (C) water-soluble particles and (D) a crosslinking agent.

6. The polishing pad according to claim 1, further comprising (C) water-soluble particles, wherein a volume ratio of said water-soluble particles is from 1 to 90% by volume, relative to the total volume of the polishing pad.

7. The polishing pad according to claim 1, further comprising (C) water-soluble particles having a particle diameter of from 0.1 to 500 μm, and wherein said water-soluble particles are present in said polishing pad in an amount of from 1 to 300 parts by weight, relative to 100 parts by weight of components (A) and (B).

8. The polishing pad according to claim 1, further comprising (C) water-soluble particles having a particle diameter of from 0.5 to 100 μm, and wherein said water-soluble particles are present in said polishing pad in an amount of from 1 to 150 parts by weight, relative to 100 parts by weight of components (A) and (B).

9. The polishing pad according to claim 1, further comprising (C) water-soluble particles having a particle diameter of from 0.5 to 100 μm, and wherein said water-soluble particles are present in said polishing pad in an amount of from 5 to 100 parts by weight, relative to 100 parts by weight of components (A) and (B).

10. The polishing pad according to claim 1, further comprising (C) water-soluble particles that comprise at least one of
organic water-soluble particles selected from the group consisting of dextrin, cyclodextrin, mannitol, a sugar, a cellulose, starch and protein; and
inorganic water-soluble particles selected from the group consisting of potassium acetate, potassium nitrate, potassium carbonate, potassium bicarbonate, potassium chloride, potassium bromide, potassium phosphate and magnesium nitrate.

11. The polishing pad according to claim 1, further comprising a crosslinking agent (D) selected from the group consisting of hydrogen peroxide, dicumyl peroxide, diethyl peroxide, di-t-butyl peroxide, diacetyl peroxide, diacyl peroxide, and sulfur.

12. The polishing pad according to claim 1, wherein components (A) and (B) comprise a first polishing layer of the polishing pad, wherein said first polishing layer
has the surface resistivity of from $2.6 \times 10^7$ to $9.9 \times 10^{13} \Omega$,
is in the form of a disk having a diameter of from 150 to 1,200 mm and a thickness of from 1.0 to 5.0 mm, and
has a shore D hardness of 35 to 100.

13. The polishing pad according to claim 1, wherein components (A) and (B) comprise a first polishing layer of the polishing pad, wherein said first polishing layer
has the surface resistivity of from $2.6 \times 10^7$ to $9.9 \times 10^{13} \Omega$,
is in the form of a disk having a diameter of from 500 to 800 mm and a thickness of from 1.5 to 3.0 mm, and
has a shore D hardness of 40 to 90.

14. The polishing pad according to claim 1, wherein said 1,2-polybutadiene has a weight average molecular weight in terms of polystyrene measured by gel permeation chromatography of from 5,000 to 1,000,000.

15. The polishing pad according to claim 1, wherein said copolymer having a polyether block has a weight average molecular weight in terms of polystyrene measured by gel permeation chromatography of from 5,000 to 5,000,000.

16. The polishing pad according to claim 1, wherein the polishing pad has a surface resistivity of $2.6 \times 10^7$ to $7.3 \times 10^{13} \Omega$.

* * * * *